(12) United States Patent
Yeh et al.

(10) Patent No.: US 9,601,674 B2
(45) Date of Patent: Mar. 21, 2017

(54) LIGHT-EMITTING DEVICE

(71) Applicant: EPISTAR CORPORATION, Hsinchu (TW)

(72) Inventors: Hui-Chun Yeh, Hsinchu (TW); Chien-Fu Shen, Hsinchu (TW); Tsun-Kai Ko, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/825,787

(22) Filed: Aug. 13, 2015

(65) Prior Publication Data

US 2017/0047494 A1    Feb. 16, 2017

(51) Int. Cl.
*H01L 33/62* (2010.01)
*H01L 33/24* (2010.01)
*H01L 27/15* (2006.01)

(52) U.S. Cl.
CPC ............ *H01L 33/62* (2013.01); *H01L 27/156* (2013.01); *H01L 33/24* (2013.01)

(58) Field of Classification Search
CPC ................... H01L 27/156; H01L 33/08; H01L 2224/49107; H01L 2224/48227; H01L 2224/48091; H01L 2224/32225; H01L 33/38; H01L 33/62; H01L 2224/18; H01L 2924/00014; H01L 2224/73265
USPC ..................................................... 362/249, 6
See application file for complete search history.

(56) References Cited

U.S. PATENT DOCUMENTS

| | | | | |
|---|---|---|---|---|
| 2009/0302334 | A1* | 12/2009 | Yao | F21K 9/00 257/93 |
| 2009/0322241 | A1* | 12/2009 | Onushkin | H01L 27/156 315/250 |
| 2010/0258824 | A1* | 10/2010 | Wang | H01L 33/38 257/91 |
| 2012/0228651 | A1* | 9/2012 | Horng | H01L 25/0753 257/93 |
| 2013/0228802 | A1* | 9/2013 | Wang | F21K 9/00 257/88 |
| 2013/0292719 | A1* | 11/2013 | Lee | H01L 33/08 257/93 |

* cited by examiner

*Primary Examiner* — Yasser A Abdelaziez
(74) *Attorney, Agent, or Firm* — Patterson + Sheridan, LLP

(57) ABSTRACT

A light-emitting device, including a substrate; a plurality of light-emitting units formed on the substrate, wherein the plurality of light-emitting units include a first light-emitting unit; a second light-emitting unit; and a group of light-emitting units formed between the first light-emitting unit and the second light-emitting unit, wherein each of the plurality of light-emitting unit includes a first-type semiconductor layer, a second-type semiconductor layer and an active layer formed between the first-type semiconductor layer and the second-type semiconductor layer; a plurality of electrical connections formed on the plurality of light-emitting units, electrically connecting each two of the light-emitting units adjacent; a first pad formed on the first light-emitting unit; a second pad and a third pad formed on the second light-emitting unit; wherein one of the plurality of electrical connection connects and extends from the second pad.

21 Claims, 5 Drawing Sheets

LIGHT-EMITTING DEVICE

BACKGROUND

Technical Field

The present disclosure relates to a light-emitting device, more particularly, to a light-emitting diode array.

Description of the Related Art

The light-emitting diodes (LEDs) of the solid-state lighting elements have the characteristics of low power consumption, low heat generation, long operation life, crash proof, small volume, quick response and good opto-electrical property like light emission with a stable wavelength, so the LEDs have been widely used in household appliances, indicator light of instruments, and opto-electrical products, etc. As the opto-electrical technology develops, the solid-state lighting elements have great progress in the light efficiency, operation life and the brightness, and LEDs are expected to become the main stream of the lighting devices in the near future.

Now, the LEDs are used in an array type light-emitting element, which can be applied to more applications with high driving voltage, and can replace all separate LEDs having larger total volume and weight. The manufacturers design various kinds of electrode layout of the array type light-emitting element to satisfy customers' requirements of LEDs with high driving voltage, and to increase the production efficiency with lower cost.

SUMMARY OF THE DISCLOSURE

The present application provides a light-emitting device, including a substrate; a plurality of light-emitting units formed on the substrate, wherein the plurality of light-emitting units include a first light-emitting unit; a second light-emitting unit; and a group of light-emitting units formed between the first light-emitting unit and the second light-emitting unit, wherein each of the plurality of light-emitting unit includes a first-type semiconductor layer, a second-type semiconductor layer and an active layer formed between the first-type semiconductor layer and the second-type semiconductor layer; a plurality of electrical connections formed on the plurality of light-emitting units, electrically connecting each two of the light-emitting units adjacent; a first pad formed on the first light-emitting unit; a second pad and a third pad formed on the second light-emitting unit; wherein one of the plurality of electrical connection connects and extends from the second pad.

The present application provides a light-emitting module, including a carrier; a light-emitting device formed on the carrier, wherein the light-emitting device includes a substrate; a first light-emitting unit and a second light-emitting unit separately formed on the substrate; and a group of light-emitting units separately formed on the substrate and between the first light-emitting unit and the second light-emitting unit, wherein the first light-emitting unit, the second light-emitting unit and the group of light-emitting units electrically connect with each other; a first pad formed on the first light-emitting unit; a second pad including an extending part extending from the second pad and a third pad formed on the second light-emitting unit, wherein the second pad and the third pad are respectively formed on different sides of the extending part; and a circuit formed on the carrier, electrically coupled with the second pad and the third pad.

DETAILED DESCRIPTION OF THE EMBODIMENTS

Figure 1A:
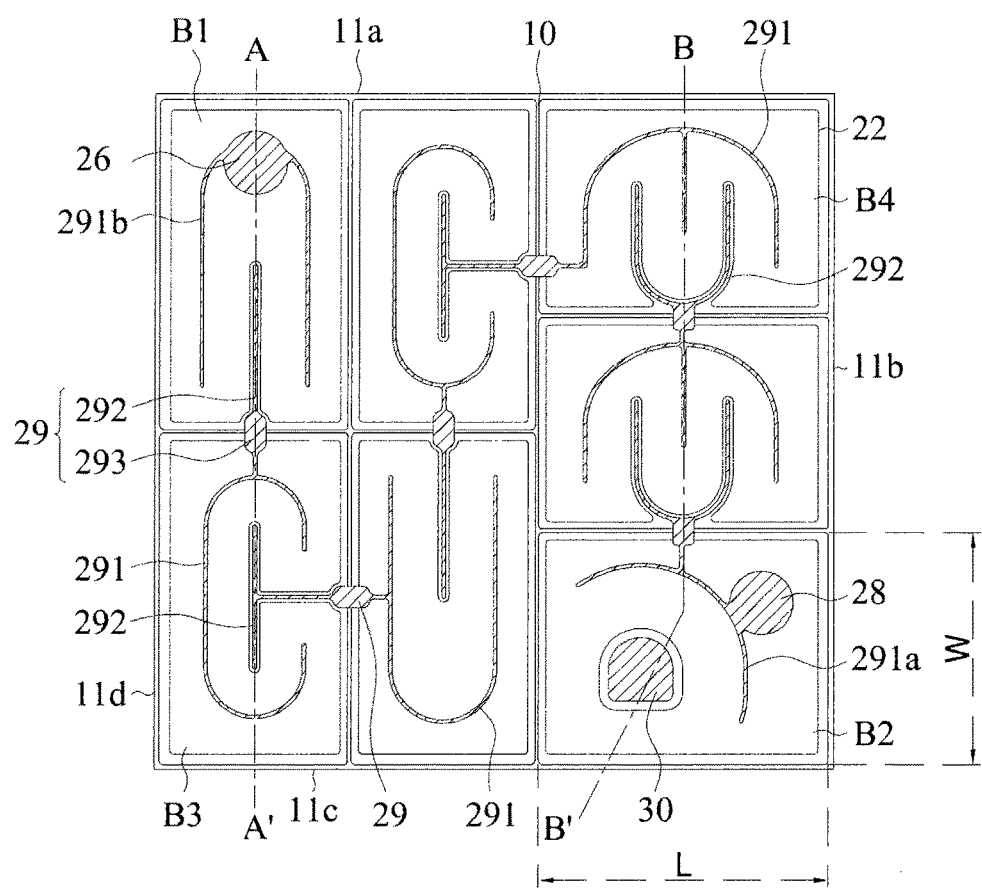
FIG. 1A shows a top view of the light-emitting device in accordance with one embodiment of present disclosure.

Reference is made in detail to the preferred embodiments of the present application, examples of which are illustrated in the accompanying drawings. Wherever possible, the same reference numbers are used in the drawings and the description to refer to the same or like parts.

Light emitting device according to embodiments of the present application may include a light emitting diode or a laser diode. The light emitting diode may include a light-emitting diode array with multiple light-emitting units on a substrate.

Figure 1B:
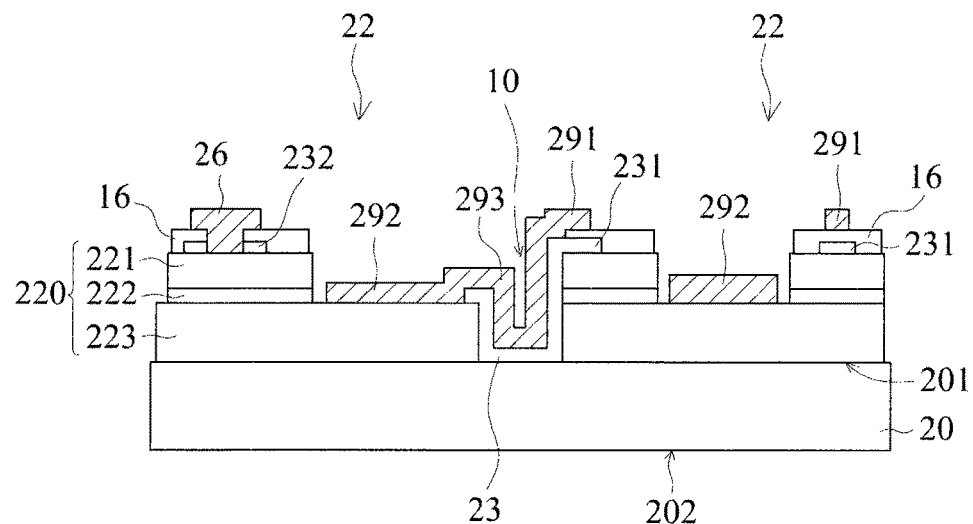
FIG. 1B and FIG. 1C show cross-sectional views of the light-emitting device in accordance with one embodiment of present disclosure.
Figure 1C:
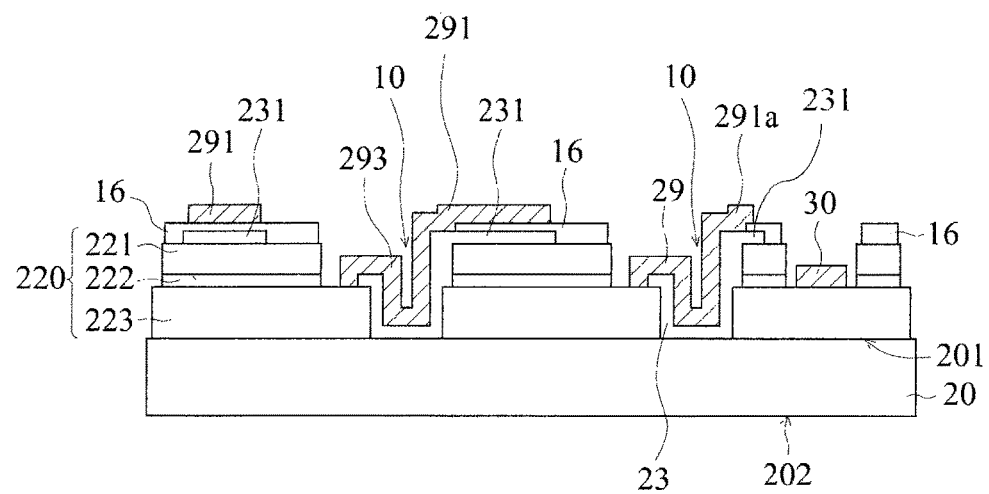

FIG. 1A~1C show a light-emitting device 2 in accordance to one embodiment of the present application. In the embodiment, the light-emitting device 2 is a light-emitting diode array. FIG. 1A shows a top view of the light-emitting device 2. FIG. 1B and FIG. 1C respectively show cross-sectional views along A-A' line and B-B' line of the top view. Referring to FIGS. 1B and 1C, the light-emitting device 2 comprises a substrate 20 having a first surface 201 and a second surface 202 opposite to the first surface 201. A plurality of light-emitting units 22 which extends and is arranged in a two-dimensional array is formed on the first surface 201 of the substrate 20. Each light-emitting unit 22 comprises an epitaxy stack 220 formed by a second-type semiconductor layer 223, a first-type semiconductor layer 221, and an active layer 222 interposed between thereof. The first-type and the second-type semiconductor layers have different polarity. For example, the first-type semiconductor layer 221 can be a p-type semiconductor layer and the second-type semiconductor layer 223 can be an n-type semiconductor layer. The materials of the first-type semiconductor layer 221, the active layer 222, and the second-type semiconductor layer 223 include one or more than one element selected form Ga, Al, In, As, P, N or the group of the materials described above. The active layer 222 can be single heterostructure (SH), double heterostructure (DH), double-side double heterostructure (DDH), multi-quantum well (MQW) or quantum dot.

The manufacturing method of the light-emitting device 2 is described as below. As described above, the epitaxy stack 220 is formed on a growth substrate (not shown) by conventional epitaxy process. Then, as shown in FIG. 1B and FIG. 1C, a portion of the epitaxy stack 220 is selectively removed by a photolithography process to expose the first surface 201 of the substrate 20. The exposed first surfaces 201 and the lateral surfaces between the adjacent epitaxy stacks 220 form trenches 10 so that the plurality of epitaxy stacks 220 of the light-emitting units 22 are separately arranged on the substrate 20. An exposed region of the second-type semiconductor layer 223 of each light-emitting unit 22 can further be formed by the photolithography process so that the exposed region serves as a platform for forming pads for connecting outside power providing current or other electronic components, or forming electrical connections which spread the injected current and/or electrically connect the adjacent units thereon.

In another embodiment, in order to increase light-extraction efficiency or heat dispersion efficiency of the light-emitting device, the epitaxy stack 220 of the light-emitting unit 22 can be disposed on the substrate 20 by wafer transfer and wafer bonding. The wafer bonding method includes direct bonding and indirect bonding. Direct bonding can be fusion bonding or anodic bonding, etc. In indirect bonding, the epitaxy stack 220 of the light-emitting unit 22 is epitaxial grown on an epitaxial substrate (not shown), and then is bonded with the substrate 20 by adhering, heating or pressuring. The epitaxy stack 220 of the light-emitting unit 22 can be adhered to the substrate 20 by an inter-medium (not shown). The inter-medium can be a transparent adhesion layer, and it also can be replaced by a metal material. The transparent adhesion layer can be organic polymer transparent glue, such as polyimide, BCB (Benzocyclobutene), PFCB (Perfluorocyclobutyl), Epoxy, Acrylic resin, PET (Polyethylene terephthalate), PC (Polycarbonate) or combination thereof; or a transparent conductive oxide metal such as ITO, InO, $Sno_2$, ZnO, FTO (fluorine-doped tin oxide), ATO (antimony tin oxide), CTO (cadmium tin oxide), AZO (aluminum-doped zinc-oxide), GZO (gallium-doped zinc oxide) or combination thereof; or an inorganic insulator, such as SOG (spin-on-glass), $Al_2O_3$, $SiN_x$, $SiO_2$, ALN, $TiO_2$, $Ta_2O_5$ or combination thereof. The metal material comprises but is not limited to Au, Sn, In, Ge, Zn, Be, Pd, Cr, or alloy thereof such as PbSn, AuGe, AuBe, AuSn, PdIn, etc.

In fact, the method of forming the epitaxy stack 220 of the light-emitting unit 22 on the substrate 20 is not limited to these approaches. People having ordinary skill in the art can understand that the epitaxy stack 220 of the light-emitting unit 22 can be directly epitaxial grown on the substrate 20 according to different characteristics of the structures, such as optical and electrical properties, or productivity. Besides, the sequence of the second-type semiconductor layer 223 near the first surface 201 of the substrate 20, and the first-type semiconductor layer 221 on the second-type semiconductor layer 223 can be changed via several times of wafer transferring.

Next, an insulator 23 (not shown in FIG. 1A) is disposed on the trenches 10 between adjacent light-emitting units 22 and continuously covers lateral surfaces and a part of the top surfaces of the epitaxy stacks 220. The insulator 23 which covers the top surface of the first-type semiconductor layer 221 further forms a current block region 231. The insulator 23 formed in the trenches 10 and on the lateral surfaces of the light-emitting units 22 protects the epitaxy stacks 220 and electrically insulates the adjacent light-emitting units 22. The material of the insulator 23 comprises but is not limited to $Al_2O_3$, $SiO_2$, AlN, $SiN_x$, $TiO_2$, $Nb_2O_5$, $Ta_2O_5$ or combination of the materials described above. Then, a transparent conductive layer 16 is disposed on the first-type semiconductor layer 221 and covers the current block region 231. The material of the transparent conductive layer 16 includes a metal oxide material such as indium tin oxide (ITO), cadmium tin oxide (CTO), antimony tin oxide (ATO), indium zinc oxide (IZO), aluminum-doped zinc oxide (AZO), or zinc tin oxide (ZTO). A metal layer with a thickness light can pass also can be the transparent conductive layer 16. Then, a first pad 26 and a second pad 28 are formed on the surfaces of the transparent conductive layer 16 and the first-type semiconductor layer 221, a third pad 30 is formed on an exposed surface of the second-type semi-conductor layer 223, and a plurality of electrical connections 29 which is totally separated with each other is formed on the insulator 23, the surfaces of the transparent conductive layer 16 and the second-type semiconductor layer 223 of each light-emitting unit 22 by sputtering. In one embodiment, the electrical connection 29 includes a connecting part 293 and extending parts 291/292 extending from the connecting part 293, the first pad 26 and the second pad 28. The pads and the extending parts compose electrodes. In the present embodiment, the extending part is a narrow part of the electrical connection 29. In these electrical connections 29, the first extending part 291 is disposed on the transparent conductive layer 16, and the second extending part 292 is disposed on the second-type semiconductor layer 223 of each light-emitting unit 22. A width of the first extending part 291 or that of the second extending part 292 is narrower than that of the connecting part 293. The connecting part 293 is formed on the insulator 23 in the trench 10 and covers the lateral surfaces and a part of the top surfaces of the adjacent light-emitting units 22 and connects to the first extending part 291 and the second extending part 292 respectively. The connecting part 293 comprises a width less than that of the insulators 23 formed thereunder. A part of the lateral surfaces of the light-emitting units 22 where the connecting parts 293 are formed on can have a slope gentler than slopes of other parts of the lateral surfaces of the light-emitting units 22. The plurality of light-emitting units 22 which are spatially separated with each other electrically connects in series via these connecting parts 293. In fact, the method of electrically connecting adjacent light-emitting units 22 is not limited to what is described above. People having ordinary skill in the art can understand that two ends of the electrical connection 29 are respectively disposed on the semiconductor layers with same polarity or different polarity of the different light-emitting units 22, so that the light-emitting units 22 can be electrically connected in series or in parallel.

Referring back to the top view shown in FIG. 1A, the light-emitting device 2 comprises the plurality of light-emitting units 22 forming an electrical series and arranged in an array. The first pad 26 and a first extending part 291b connecting with the first pad 26 are formed on the first-type semiconductor layer 221 of the first light-emitting unit B1 at one end of the array. The second pad 28 and a first extending part 291a connecting with the second pad 28 are formed on the first-type semiconductor layer 221 of the second light-emitting unit B2 at the other end of the array. The third pad 30 is formed on the exposed surface of the second-type semiconductor layer 223 of the second light-emitting unit B2. The first light-emitting unit B1 can be the start unit of the electrical series and the second light-emitting unit B2 can be the end unit of the electrical series. Thus, the light-emitting device 2 electrically connects to an external power or other circuits by wiring or soldering the first pad 26 and the third pad 30. The process of forming the first pad 26, the second pad 28 and the third pad 30 can be performed in the same process of forming the electrical connections 29. It also can be completed by several processes. The material of the pads can be the same as or different from that of the electrical connections 29. In order to achieve a specific conductivity, the material of the first pad 26, the second pad 28, the third pad 30 and the electrical connections 29 is preferably metal, such as Au, Ag, Cu, Cr, Al, Pt, Ni, Ti, Sn, alloy or stacked composition of the materials described above.

The shape of the first extending part 291 can be the same as that of the current block region 231. The width of the first extending part 291 can be slightly smaller than or the same as that of the current block region 231. As shown in FIG. 1B, the other current block regions 232 are formed under the first pad 26 and the second pad 28 in a similar way. Each current block region 232 has the same circumference as the first or the second pads 26/28 formed thereon. A hollowed portion is formed in the current block region 232 under the first pad 26 and/or the second pad 28 from a top view, and the transparent conductive layer 16 also has openings corresponding to the hollowed portion. The first pad 26 and the second pad 28 pass through the hollowed portions and openings of the transparent conductive layer 16 thereby contact the first-type semiconductor layer 221. In another embodiment, the current block region 232 and the transparent conductive layer 16 do not comprise the hollowed portion, i.e. the transparent conductive layer 16 is formed on and encompasses the current block region 232, and the first pad 26 and/or the second pad 28 is formed on the transparent conductive layer 16 and electrically connects to the first-type semiconductor layer 221 via the transparent conductive layer 16. Being similar with the current block region 231, the contour of the current block region 232 can be aligned with the pads 26/28 and slightly wider than the pads 26/28. Besides, the current block region 232 can be further formed under the first extending parts 291b and 291a. The process of forming the current block regions 231/232 and the insulator 23 can be performed in the same process. It also can be completed by several processes. The current block regions 231/232 suppress the most part of current from flowing into the active layer 222 under the electrical connections 29 or the pads 26/28, and current can be uniformly spread into the semiconductor layers by the transparent conductive layer 16.

As shown in FIG. 1A, the first and/or the second extending part 291/292 has branches for better current spreading and conductivity. For example, as shown in the light-emitting unit B3, if the first-type semiconductor layer 221 is a p-type nitride semiconductor which has a higher resistance than n-type nitride semiconductor, the first extending part 291 can be configured as a branch shape to surround the second extending part 292 therein. Furthermore, as shown in the light-emitting unit B4, the first extending part 291 and the second extending part 292 interdigitate with each other. As a result, current crowding of the light-emitting units 22 is reduced and current spreading is more uniform so as to improve luminous efficiency of the light-emitting device 2.

In order to satisfy customers' request that the light-emitting device can work under a required area, current and driving voltage, the layouts of the light-emitting units 22, the electrical connections and the pads have to be designed. The equation of the number of light-emitting unit 22 is:

$$n = \left(\frac{V}{V_f} - 1\right),$$

$$\left(\frac{V}{V_f}\right),$$

or $$\left(\frac{V}{V_f} + 1\right),$$

wherein n is the number of semiconductor unit, V is the driving voltage of the light-emitting device, $V_f$ is the driving voltage of the light-emitting unit. In the embodiment, the driving voltage of the light-emitting device 2 is about 21V. The driving voltage of each light-emitting unit is substantially 3V. The driving voltage of the light-emitting unit can be changed through the manufacture process control and the quality of the epitaxy layers. Normally, the lower driving voltage of the light-emitting unit is better at the electrical efficiency of the light-emitting device 2. In order to connect the plurality of light-emitting units 22 in the light-emitting device 2, each light-emitting unit 22 has smaller light-emitting area. While the area of each light-emitting unit 22 of the array becomes smaller, the opaque structures on the light-emitting surface, such as the pads, and the extending parts of the electrical connection greatly affect the light extraction efficiency of the light-emitting units. Thus, for the second light-emitting unit B2 which comprise the second pad 28 on the first-type semiconductor layer 221 and the third pad 30 on the second-type semiconductor layer 223, how to improve current spreading as well as remain the light-emitting area is important. For example, in FIG. 1A, the third pad 30 has no any extending part extending therefrom so that the etched area of the active layer 222, and the area of the second-type semiconductor layer 223 sheltered by the electrode can be reduced. In order to improve current spreading and current uniformity, the first extending part 291a extends from the second pad 28 to surround the third pad 30. To be more specific, the first extending part 291a extends from a side surface of the second pad 28 which faces the third pad 30, and extends along a part of the contour of the third pad 30 with a non-enclosed form so that the second pad 28 and the third pad 30 are separated in different sides of the first extending part 291a from a top view. As described above, since the third pad 30 has no extending part for current spreading, the third pad 30 can be formed on a central area of the second light-emitting unit B2 and surrounded by the first extending part 291a extending from the second pad 28. The third pad 30 is formed on an area spaced apart from any edge of the second light-emitting unit B2. In this manner, distance between each portion of the first extending part 291a and the third pad 30 can be substantially equal and current flows from the first extending part 291a to the third pad 30 in various directions is uniform. Furthermore, the non-enclosed first extending parts 291a can avoid unnecessary light-sheltering on condition of the uniformity of current spreading. Thus, current spreading can be improved and the light-emitting area can also be remained. In one embodiment, according to different kind of series connecting, the end light-emitting unit can be one of the light-emitting units except the light-emitting units B1 and B2. Accordingly, the second pad 28 and the third pad 30 can be disposed on the light-emitting unit which is the end unit of the electrical series.

In this embodiment, the light-emitting device 2 comprises seven light-emitting units arranged in three rows. The start unit B1 and the end unit B2 are formed on a diagonal of the substrate 20, such as on two diagonal corners of the substrate 20. The number of the units in each row as well as the area of the units in each row can be different. The aspect ratio of second light-emitting unit B2 is preferably smaller than 5. The aspect ratio indicates the ratio of the length L and the width W of the second light-emitting unit B2 from a top view. While the aspect ratio of second light-emitting unit B2 is more close to 1:1, the current spreading is more uniform. The second light-emitting unit B2 can also be substantially a square.

Figure 2A:
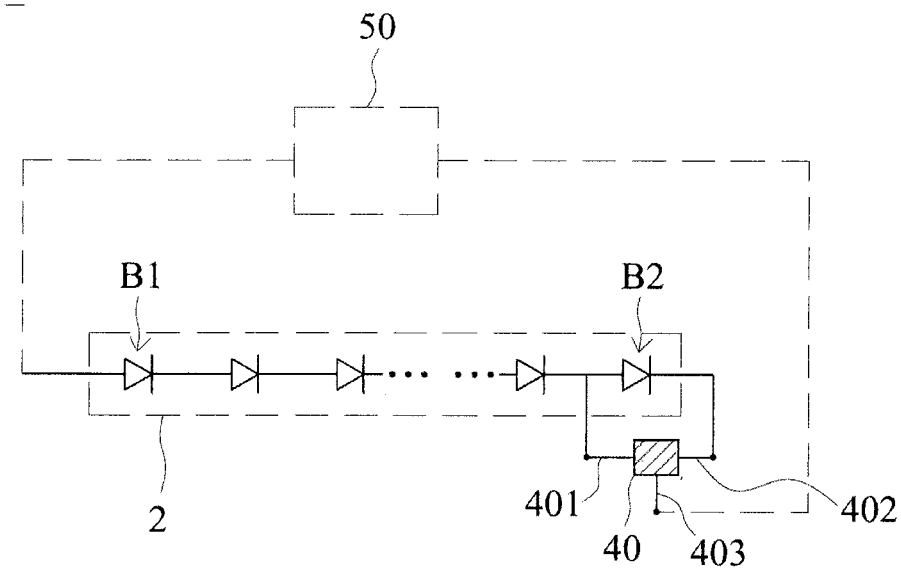
FIGS. 2A~2B show circuit diagrams of the light-emitting device in accordance with one embodiment of present disclosure.
Figure 2B:
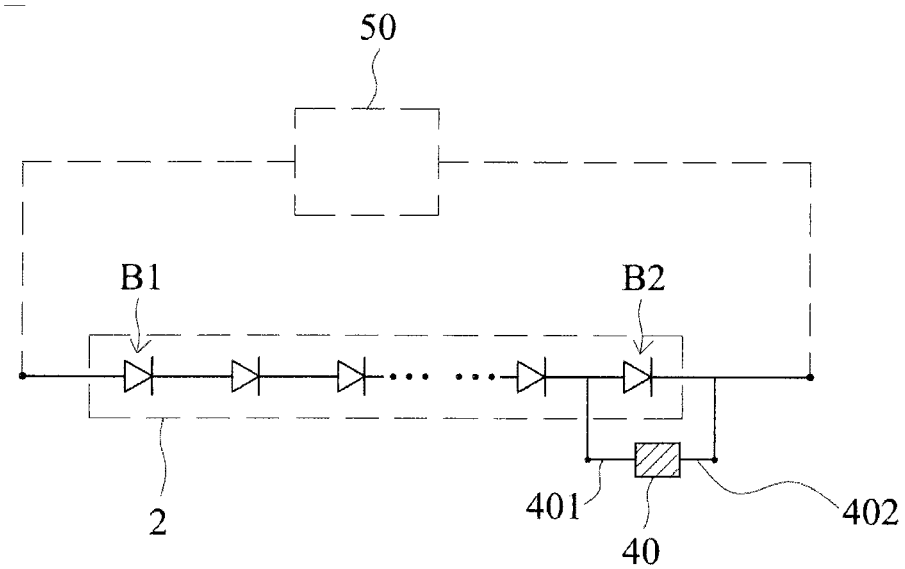

FIG. 2A shows one equivalent circuit diagram of a light-emitting module 3 which comprises the light-emitting device 2 in accordance with the embodiment described above. The light-emitting module 3 comprises a carrier (not shown) for carrying the light-emitting device 2 and a circuit 40 such as a driver IC thereon. The light-emitting device 2, and the carrier (and other circuit formed thereon) can be encapsulated in one package. The circuit 40 can be engaged in the package such as formed on the carrier, or spatially separated from the package. The circuit 40 has three terminals 401/402/403. Two terminals 401/402 respectively connect to the second pad 28 and the third pad 30 of the second light-emitting unit B2, and the third terminal 403 connects to a power source 50 or other electronic devices so that the circuit 40 electrically connects to the second light-emitting unit B2 in parallel. Then, the first pad 26 of the first light-emitting unit B1 and the third terminal 403 of the circuit connect to the power source 50 or other electronic devices. The function of the circuit 40 comprises detecting the operating voltage of the second unit B2 and adjusting or keeping the current flowing into the light-emitting device 2 according to the detected voltage. In another embodiment, the light-emitting device 2 and the circuit 40 form a light-emitting group, and the light-emitting module 3 comprises a plurality of the groups connecting with each other in parallel. The connection between the circuit 40 and the second/third pads can be wires or solder bonding. FIG. 2B shows another equivalent circuit diagram of a light-emitting module 4 which comprises the light-emitting device 2 in accordance with the embodiment described above. In FIG. 2B, the circuit 40 comprises two terminals 401/402. Two terminals 401/402 respectively connect to the second pad 28 and the third pad 30 of the second light-emitting unit B2. People having ordinary skill in the art can understand that the light-emitting device having two pads on the end unit can be applied in the equivalent circuit as described above. Other embodiments of the light-emitting device which can also be applied will be described in FIG. 3 and FIG. 4 as following.

In one embodiment, the second pad 28 formed on the first-type semiconductor layer 221 of the second light-emitting unit B2 can be modified and replaced by a pad (not shown) formed on the second-type semiconductor layer 223 of the first light-emitting unit B1. The two terminals 401/402 respectively connect to the first pad 26 and the pad (not shown) on the first light-emitting unit B1, and the third terminal 403 connects to a power source 50. The circuit 40 can detecting the operating voltage of the first unit B1 and adjusting or keeping the current flowing into the light-emitting device 2 according to the detected voltage.

Referring back to FIG. 1A, since the area of one light-emitting unit is small, connecting the second pad 28 and the third pad 30 to the circuit 40 by wiring process or soldering process becomes more difficult. Thus, as shown in FIG. 1A, the second pad 28 and the third pad 30 are located on the diagonal line of the second light emitting unit B2. The substrate 20 of the light-emitting device 2 has four edges 11a~11d, and the second pad 28 is located near one outer edge 11b. That is, the second pad 28 which is adjacent to the outer edge 11b of the light-emitting device 2 enable following wiring process or soldering process more convenient. However, the equivalent circuit diagram and the electrical connecting between the circuit 40, the second light-emitting unit B2 and the power source 50 (or other electronic device) are not limited to the embodiments describe above. Since the light-emitting device 2 has one more pad on the end unit, it is more flexibility in connecting and wiring between the light-emitting device and any electronic circuit. Besides, the package of the light-emitting device can be more compact.

Figure 3:
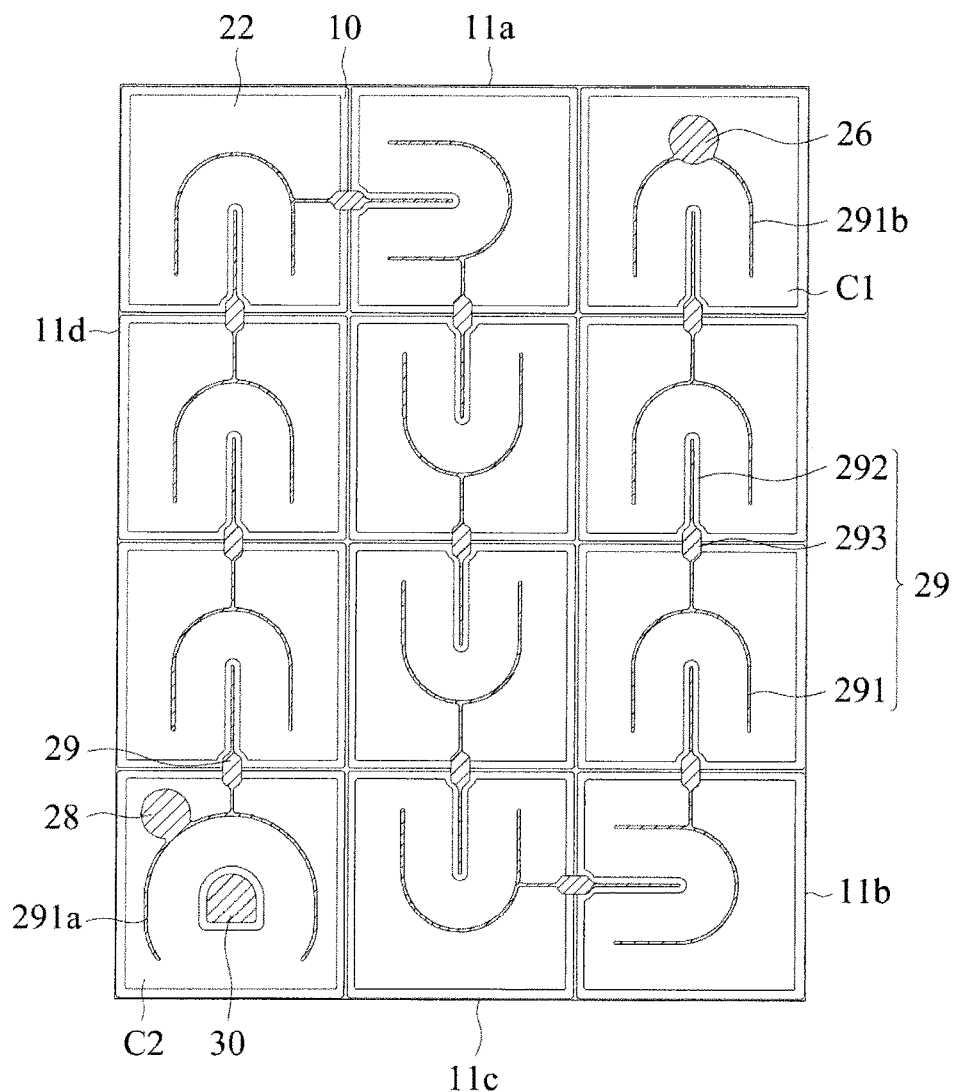
FIG. 3 shows a top view of the light-emitting device in accordance with another embodiment of present disclosure.

FIG. 3 shows a top view of a light-emitting device 5 in accordance with another embodiment of the present disclosure. The cross-sectional structure of the light-emitting device 5 is similar to the light-emitting device 2 described above. In this embodiment, the light-emitting device 5 has twelve light-emitting units 22 electrically connecting in series and arranged in a 3×4 array. Each light-emitting unit 22 is substantially a square with the same area. The first pad 26 is formed on the first-type semiconductor layer 221 of the first light-emitting unit C1 (i.e. the start unit). The second pad 28 and the third pad 30 are respectively formed on the first-type semiconductor layer 221 and the second-type semiconductor layer 223 of the second light-emitting unit C2 (i.e. the end unit). The third pad 30 which has no extending part is formed on a central area of the second light-emitting unit C2, and to be more specific, the third pad 30 is formed near the center of the second light-emitting unit C2 from a top view. The second pad 28 is located near one corner of the second light-emitting unit C2 which is adjacent to the previous unit. The first extending part 291a extends from the second pad 28, and stretches along a part of the contour of the third pad 30 so as to surround the third pad 30. The second pad 28 and the third pad 30 are formed on different sides of the first extending part 291a from a top view and the second pad 28 is located near one of the edge 11d of the light-emitting device 5. Since the second light-emitting unit C2 is substantially a square, and the third pad 30 is substantially formed near the center of the unit C2 and surrounded by the first extending part 291a, the current spreading is uniform.

Figure 4:
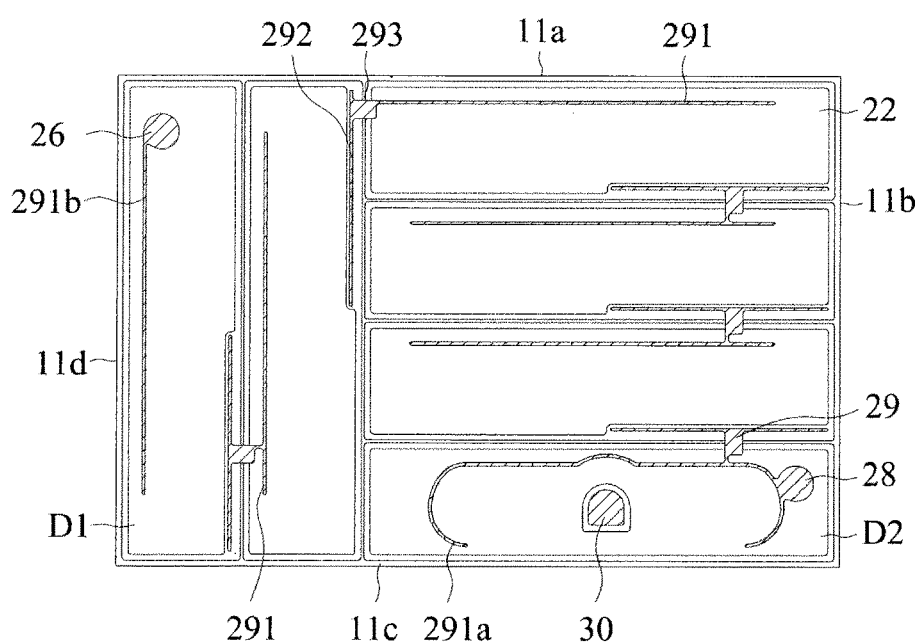
FIG. 4 shows a top view of the light-emitting device in accordance with another embodiment of present disclosure.

FIG. 4 shows a top view of a light-emitting device 6 in accordance with another embodiment of the present disclosure. The cross-sectional structure of the light-emitting device 6 is similar to the light-emitting device 2 described above. In this embodiment, the light-emitting device 6 has six light-emitting units 22 electrically connecting in series. Each unit is a rectangle and has an aspect ratio smaller than five. The first extending part 291 and the second extending part 292 are formed on two opposite sides of the light-emitting unit 22. The first pad 26 is formed on the first-type semiconductor layer 221 of the first light-emitting unit D1. The second pad 28 and the third pad 30 are respectively formed on the first-type semiconductor layer 221 and the second-type semiconductor layer 223 of the second light-emitting unit D2. The third pad 30 which has no extending part is formed on a central area of the second light-emitting unit D2, and to be more specific, the third pad 30 is formed at substantially the center of the second light-emitting unit D2. The second pad 28 is located near one corner of the second light-emitting unit D2 and near the edge 11b of the light-emitting device 6 for wiring or soldering. The first extending part 291a extends from the second pad 28, and stretches toward the third pad 30 so as to surround the third pad 30. The second pad 28 and the third pad 30 are formed on different sides of the first extending part 291a from a top view.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting module, comprising:
a carrier;
a light-emitting device formed on the carrier, comprising
a substrate;
a first light-emitting unit and a second light-emitting unit separately formed on the substrate;
a group of light-emitting units separately formed on the substrate and between the first light-emitting unit and the second light-emitting unit, wherein the first light-emitting unit, the second light-emitting unit and the group of light-emitting units electrically connect with each other;
a first pad formed on the first light-emitting unit;
a second pad formed on the second light-emitting unit;
a plurality of electrical connections formed on the group of light-emitting units, electrically connecting each two of the group of light-emitting units adjacent, wherein one of the plurality of electrical connections comprises a first extending part which extends from the second pad, a connecting part and a second extending part formed on one of the group of light-emitting units adjacent to the second light-emitting unit, wherein one end of the connecting part connects to the first extending part and another end of the connecting part connects to the second extending part;
a third pad formed on the second light-emitting unit, wherein the second pad and the third pad are respectively formed on different sides of the first extending part; and
a circuit device formed on the carrier, electrically coupled with the second pad and the third pad.

2. The light-emitting module of claim 1, wherein the first light-emitting unit and the second light-emitting unit are respectively formed on two diagonal corners of the substrate.

3. The light-emitting module of claim 1, wherein the first light-emitting unit, the second light-emitting unit and the group of light-emitting units electrically connect with each other in series, the first light-emitting unit is a start unit of the series and the second light-emitting unit is an end unit of the series.

4. A light-emitting device, comprising:
a substrate;
a plurality of light-emitting units formed on the substrate, comprising:
a first light-emitting unit;
a second light-emitting unit; and
a group of light-emitting units formed between the first light-emitting unit and the second light-emitting unit, wherein each of the plurality of light-emitting unit comprises a first-type semiconductor layer, a second-type semiconductor layer and an active layer formed between the first-type semiconductor layer and the second-type semiconductor layer;
a plurality of electrical connections formed on the plurality of light-emitting units, electrically connecting each two of the plurality of light-emitting units adjacent;
a first pad formed on the first light-emitting unit; and
a second pad and a third pad formed on the second light-emitting unit;
wherein one of the plurality of electrical connections comprises a connecting part, a first extending part connecting to and extending from the second pad and a second extending part formed on one of the group of light-emitting units adjacent to the second light-emitting unit, wherein one end of the connecting part connects to the first extending part and another end of the connecting part connects to the second extending part.

5. The light-emitting device of claim 4, wherein the connecting part is wider than the first and the second extending parts.

6. The light-emitting device of claim 4, wherein the second pad and the third pad are respectively formed on the first-type semiconductor layer and the second-type semiconductor layer of the second light-emitting unit.

7. The light-emitting device of claim 4, wherein the first extending part surrounds the third pad.

8. The light-emitting device of claim 7, wherein the second pad and the third pad are respectively formed on different sides of the first extending part from a top view.

9. The light-emitting device of claim 4, wherein an aspect ratio of the second light-emitting unit is smaller than 5.

10. The light-emitting device of claim 9, wherein the second light-emitting unit substantially is a square.

11. The light-emitting device of claim 4, wherein the third pad is devoid of electrical connections extending therefrom.

12. The light-emitting device of claim 4, wherein the second-type semiconductor layer comprises an exposed surface; the third pad is formed on the exposed surface and the exposed surface is spaced apart from edges of the second light-emitting unit.

13. The light-emitting device of claim 4, wherein the second pad and the third pad are substantially formed on a diagonal line of the second light-emitting unit.

14. The light-emitting device of claim 13, wherein the second pad is formed near one corner of the second light-emitting unit.

15. The light-emitting device of claim 13, wherein the substrate has four edges and the second pad is near one edge of the substrate.

16. The light-emitting device of claim 4, wherein the first extending part extends along a contour of the third pad.

17. The light-emitting device of claim 4, wherein the second pad comprises a side surface, wherein a part of the side surface facing the third pad, and the first extending part extends from the part of the side surface.

18. The light-emitting device of claim 4, wherein one of the plurality of electrical connections on the group of light-emitting units comprises a third extending part formed on the first-type semiconductor layer of one of the group of light-emitting unit and a fourth extending part formed on the second-type semiconductor layer of another one of the group of light emitting units adjacent the one of the group of light emitting units, wherein the third extending part surrounds the fourth extending part of an adjacent electrical connection.

19. The light-emitting device of claim 4, wherein the third pad is formed on a central area of the second light-emitting unit and does not comprise electrical connections extending therefrom, and the first extending part extends along a contour of the third pad.

20. The light-emitting device of claim 4, wherein the first pad is formed on the first-type semiconductor layer of the first light-emitting unit.

21. The light-emitting device of claim 4, wherein each of the plurality of electrical connections on the group of light-emitting units comprises:
another connecting part;
a third extending part extending from the another connecting part and formed on the first-type semiconductor layer of one of the group of light emitting units; and a fourth extending part extending from the another connecting part and formed on the second-type semiconductor layer of another one of the group of light emitting units adjacent the one of the group of light emitting units;
wherein the another connecting part is wider than the third and the fourth extending parts.

* * * * *